United States Patent
Chien et al.

(10) Patent No.: US 10,615,629 B2
(45) Date of Patent: Apr. 7, 2020

(54) WIRELESS DEVICE

(71) Applicant: TDK TAIWAN CORP., Taoyuan (TW)

(72) Inventors: Feng-Lung Chien, Taoyuan (TW);
Chien-Hung Lin, Taoyuan (TW);
Hsiang-Hui Hsu, Taoyuan (TW); Ni-Ni Lai, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 0 days.

(21) Appl. No.: 16/128,817

(22) Filed: Sep. 12, 2018

(65) Prior Publication Data

US 2019/0089188 A1 Mar. 21, 2019

Related U.S. Application Data

(60) Provisional application No. 62/559,105, filed on Sep. 15, 2017.

(30) Foreign Application Priority Data

Aug. 9, 2018 (CN) .......................... 2018 1 0903972

(51) Int. Cl.
*H04B 5/00* (2006.01)
*H02J 7/02* (2016.01)
(Continued)

(52) U.S. Cl.
CPC ............... *H02J 7/025* (2013.01); *H01F 3/10* (2013.01); *H01F 27/24* (2013.01); *H01F 27/255* (2013.01); *H01F 27/2804* (2013.01); *H01F 27/2823* (2013.01); *H01F 27/40* (2013.01); *H01F 38/14* (2013.01); *H02J 50/10* (2016.02); *H02J 50/12* (2016.02); *H04B 5/0037* (2013.01); *H04B 5/0081* (2013.01); *H05K 1/028* (2013.01); *H05K 1/165* (2013.01); *H01F 27/2871* (2013.01)

(58) Field of Classification Search
CPC . H02J 50/10; H02J 50/12; H02J 7/025; H04B 5/0037; H04B 5/0081; H01F 3/10; H01F 27/24
See application file for complete search history.

(56) References Cited

U.S. PATENT DOCUMENTS

2016/0172896 A1* 6/2016 Hidaka .................... H01F 38/14
320/108
2017/0244271 A1* 8/2017 Kim .................... H01F 1/14741
(Continued)

*Primary Examiner* — Tuan Pham
(74) *Attorney, Agent, or Firm* — Muncy, Geissler, Olds & Lowe, P.C.

(57) ABSTRACT

A wireless device is provided, and the wireless device includes a first magnetic conductive plate, a second magnetic conductive plate and a coil assembly. The second magnetic conductive plate is disposed on the first magnetic conductive plate. The coil assembly is disposed on the second magnetic conductive plate. The coil assembly includes a starting end and a terminating end, and the coil assembly is wound around a winding axis to form a spiral structure. The terminating end is located outside of the spiral structure. The coil assembly includes at least three metal wires which are arranged parallel to each other along the second magnetic conductive plate and are connected to each other in parallel at the starting end and the terminating end.

16 Claims, 7 Drawing Sheets

(51) Int. Cl.
  *H01F 27/28*    (2006.01)
  *H01F 27/24*    (2006.01)
  *H05K 1/16*     (2006.01)
  *H02J 50/10*    (2016.01)
  *H05K 1/02*     (2006.01)
  *H02J 50/12*    (2016.01)
  *H01F 3/10*     (2006.01)
  *H01F 27/255*   (2006.01)
  *H01F 38/14*    (2006.01)
  *H01F 27/40*    (2006.01)

(56) References Cited

U.S. PATENT DOCUMENTS

2017/0317517 A1\* 11/2017 Chiu ..................... H01F 41/069
2018/0198209 A1\*  7/2018 Kang ..................... H01Q 7/06

\* cited by examiner

WIRELESS DEVICE

CROSS REFERENCE TO RELATED APPLICATIONS

This application claims the benefit of U.S. Provisional Application No. 62/559,105, filed Sep. 15, 2017, and China Patent Application No. 201810903972.X, filed Aug. 9, 2018, the entirety of which are incorporated by reference herein.

BACKGROUND OF THE DISCLOSURE

Field of the Disclosure

The present disclosure relates to a wireless device, and more particularly to a wireless device that has two magnetic conductive plates on two layers.

Description of the Related Art

As technology has progressed, many kinds of electronic devices such as tablet computers and smartphones have begun to include the functionality of wireless charging. A user can place the electronic device on a wireless charging transmitting terminal, so that the wireless charging receiving terminal in the electronic device generates current by electromagnetic induction or electromagnetic resonance to charge the battery. Due to the convenience of wireless charging, electronic devices equipped with wireless charging modules have gradually become popular.

In general, the wireless charging device includes a magnetic conductive plate to support a coil. When the coil is provided with electricity to operate in a wireless charging mode or a wireless communication mode, the magnetic conductive plate can concentrate the magnetic lines of force emitted from the coil for better performance. For example, the magnetic conductive plate is provided for preventing image effects and it can effectively guide the magnetic lines of force of the coil. However, existing coils and the structural configuration of the magnetic conductive plate are not able to meet various requirements for wireless devices, such as better charging performance and less thickness.

Therefore, how to design a wireless device with good charging performance and a smaller overall thickness is a topic nowadays that needs to be discussed and solved.

BRIEF SUMMARY OF THE DISCLOSURE

Accordingly, one objective of the present disclosure is to provide a wireless device to solve the above problems.

According to some embodiments of the disclosure, a wireless device is provided, and the wireless device includes a first magnetic conductive plate, a second magnetic conductive plate and a coil assembly. The second magnetic conductive plate is disposed on the first magnetic conductive plate. The coil assembly is disposed on the second magnetic conductive plate. The coil assembly includes a starting end and a terminating end, and the coil assembly is wound around a winding axis to form a spiral structure. The terminating end is located outside of the spiral structure. The coil assembly includes at least three metal wires which are arranged parallel to each other along the second magnetic conductive plate and are connected to each other in parallel at the starting end and the terminating end.

According to some embodiments, the wireless device further includes a circuit board disposed between the first magnetic conductive plate and the second magnetic conductive plate, and the circuit board is configured to be electrically connected to the starting end.

According to some embodiments, an opening is formed on the second magnetic conductive plate, the circuit board is connected to the starting end through the opening, and the opening partially overlaps the starting end of the coil assembly when viewed along the winding axis.

According to some embodiments, a portion of the first magnetic conductive plate and a portion of the second magnetic conductive plate that do not correspond to the circuit board are directly bonded to each other.

According to some embodiments, when viewed along a direction perpendicular to the winding axis, the first magnetic conductive plate partially overlaps the circuit board or the second magnetic conductive plate partially overlaps the circuit board.

According to some embodiments, the wireless device further includes a circuit board disposed on the first magnetic conductive plate and configured to be electrically connected to the starting end. A slot is formed on the second magnetic conductive plate, and the circuit board is disposed in the slot. In addition, the circuit board partially overlaps the coil assembly when viewed along the winding axis.

According to some embodiments, the first magnetic conductive plate under the slot of the second magnetic conductive plate does not have any openings for avoiding magnetic leakage.

According to some embodiments, the second magnetic conductive plate has a polygonal structure, the coil assembly includes a straight portion, and the straight portion is parallel to one side of the polygonal structure of the second magnetic conductive plate.

According to some embodiments, the thickness of the first magnetic conductive plate is greater than the thickness of the second magnetic conductive plate.

According to some embodiments, the wireless device further includes a flexible circuit board, and the coil assembly and the flexible circuit board are integrally formed in one piece.

According to some embodiments of the disclosure, a wireless device is provided, and the wireless device includes a first magnetic conductive plate, a second magnetic conductive plate, a coil assembly, and a control circuit. The second magnetic conductive plate is disposed on the first magnetic conductive plate. The coil assembly is disposed on the second magnetic conductive plate. The coil assembly includes a starting end and a terminating end, and the coil assembly is wound around a winding axis to form a spiral structure. The terminating end is located outside of the spiral structure. The coil assembly includes at least three metal wires, and the metal wires are separately connected to the control circuit, and the control circuit is configured to control the metal wires to be electrically connected to each other in parallel or in series.

According to some embodiments, when the metal wires are electrically connected to each other in series, the coil assembly operates in a wireless communication mode.

According to some embodiments, when the metal wires are electrically connected to each other in parallel, the coil assembly operates in a wireless charging mode.

The present disclosure provides a wireless device that can be disposed on a main circuit board of an electronic device, and the wireless device can include two magnetic conductive plates. The thickness of the first magnetic conductive plate is greater than the thickness of the second magnetic conductive plate, and the first magnetic conductive plate is closer to the aforementioned main circuit board. Based on this structural design, the two magnetic conductive plates can effectively reduce the risk of affecting various electronic components on the main circuit board by the electromagnetic waves generated by the coil assembly according to the surface effect, and can also improve the operational efficiency of the wireless device.

Furthermore, the coil assembly can include at least three metal wires that can be separately connected to the control circuit, and the control circuit can control the metal wires to be electrically connected in parallel or in series. When the control circuit controls the metal wires to be electrically connected in parallel, the overall resistance value of the coil assembly can be reduced so as to operate in a wireless charging mode. When the control circuit controls the metal wires to be electrically connected in series, the overall inductance of the coil assembly can be adjusted so that the coil assembly can operate in a wireless communication mode. Therefore, the control circuit can switch the wireless device between different modes (for example, different types of charging modes such as inductive wireless charging, resonant wireless charging, and other wireless communication modes such as near field communication).

Additional features and advantages of the disclosure will be set forth in the description which follows, and, in part, will be obvious from the description, or can be learned by practice of the principles disclosed herein. The features and advantages of the disclosure can be realized and obtained by means of the instruments and combinations pointed out in the appended claims. These and other features of the disclosure will become more fully apparent from the following description and appended claims, or can be learned by the practice of the principles set forth herein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE ILLUSTRATIVE EMBODIMENTS

Figure 1:
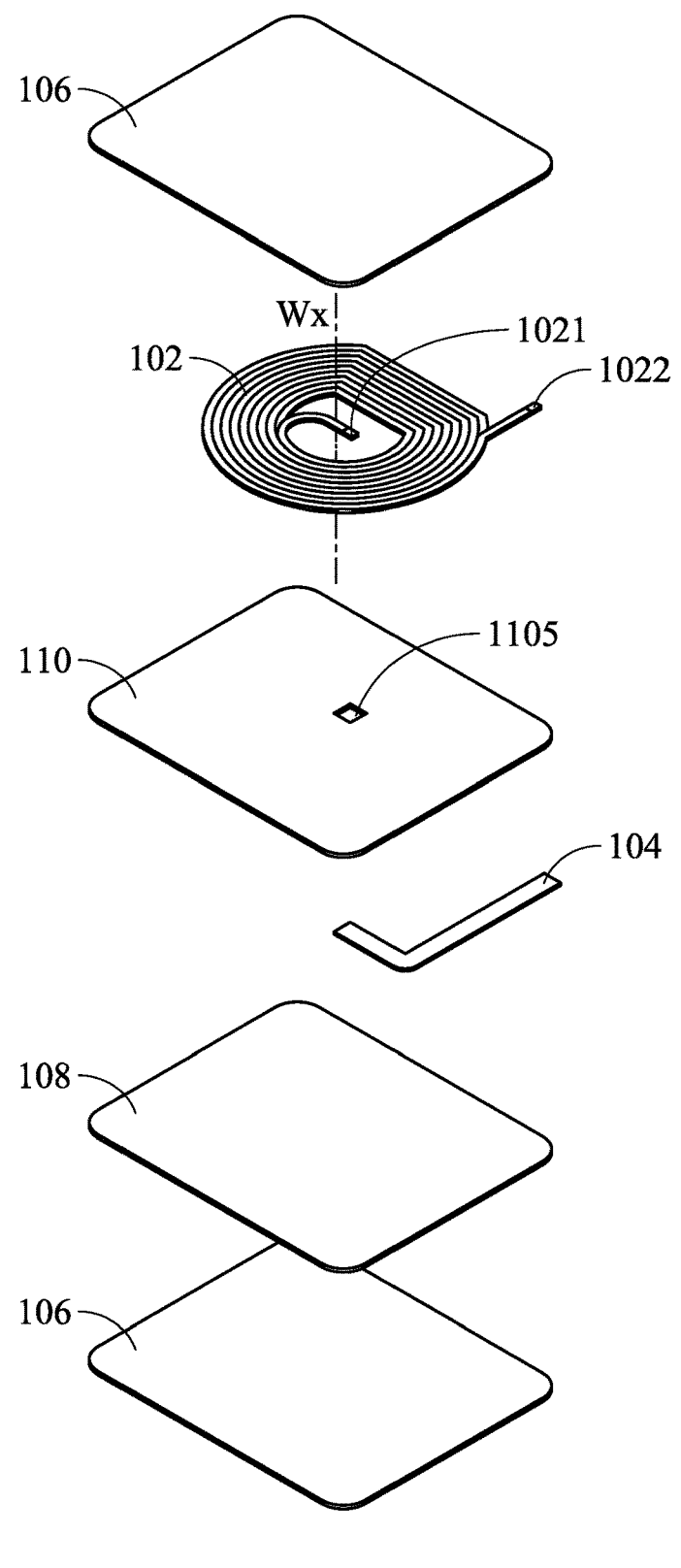
FIG. 1 is an exploded diagram of a wireless device according to an embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Please refer to FIG. 1, which is an exploded diagram of a wireless device 100 according to an embodiment of the present disclosure. As shown in FIG. 1, the wireless device 100 can include a coil assembly 102, a circuit board 104, two insulating sheets 106, a first magnetic conductive plate 108 and a second magnetic conductive plate 110. In this embodiment, the second magnetic conductive plate 110 is disposed on the first magnetic conductive plate 108, and the circuit board 104 is disposed between the first magnetic conductive plate 108 and the second magnetic conductive plate 110. Furthermore, the coil assembly 102 is disposed on the second magnetic conductive plate 110. The coil assembly 102 includes a starting end 1021 and a terminating end 1022, the circuit board 104 is configured to be electrically connected to the starting end 1021, and the circuit board 104 can be electrically connected to an external circuit, such as a control chip, so that the starting end 1021 is also electrically connected to the external circuit.

As shown in FIG. 1, the two insulating sheets 106 of the wireless device 100 are disposed on the upper side and lower side of the elements, and when the wireless device 100 is disposed on a main circuit board of an electronic device (for example, a tablet computer or a smart phone), the insulating sheets 106 are configured to protect the aforementioned elements to avoid unnecessary electrical connection. In addition, it should be noted that, in this embodiment, the first magnetic conductive plate 108 and the second magnetic conductive plate 110 can be a ferrite, the thickness of the first magnetic conductive plate 108 is greater than the second magnetic conductive plate 110, and the first magnetic conductive plate 108 is closer to the aforementioned main circuit board. For example, in this embodiment, the thickness of the first magnetic conductive plate 108 can be 0.08 mm, and the thickness of the second magnetic conductive plate 110 can be 0.02 mm, but they are not limited to this embodiment.

Because the present disclosure provides two magnetic conductive plates, the surface effect (the electromagnetic wave interface effect) of two (or more) magnetic conductive plates can enhance the effect of isolating and concentrating the electromagnetic waves. That is, the risk of affecting the various electronic components on the main circuit board by the electromagnetic waves generated by the coil assembly 102 during operation can be effectively reduced. Furthermore, the thickness of the first magnetic conductive plate 108 of the present disclosure is large and closer to the main circuit board of the electronic device, so that the influence of the coil assembly 102 to the main circuit board can be reduced further, and the operating efficiency of the wireless device 100 can be improved. For example, the charging efficiency can be improved.

Figure 2:
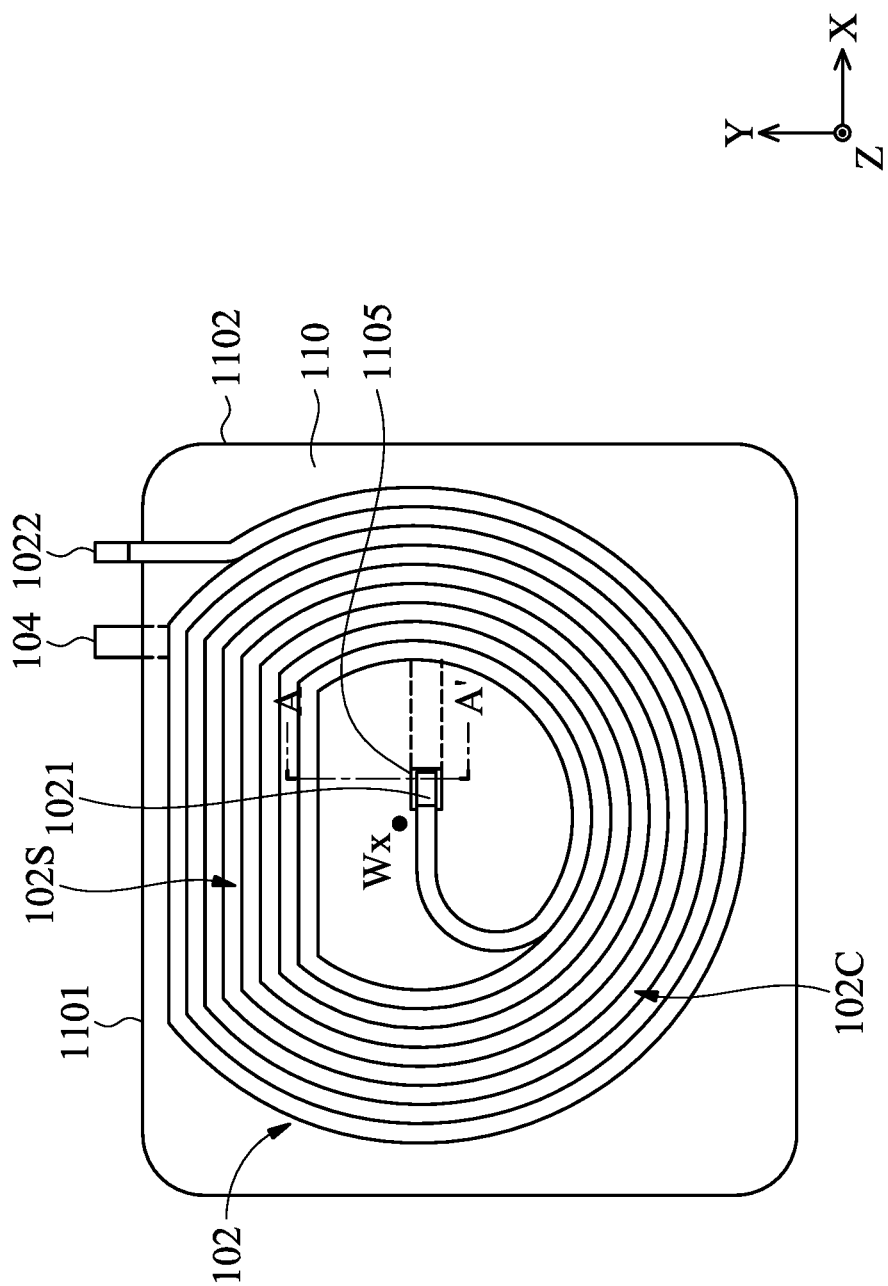
FIG. 2 shows a top view of the coil assembly and the second magnetic conductive plate according to the embodiment in FIG. 1 of the present disclosure.

Please refer to FIG. 1 and FIG. 2. FIG. 2 shows a top view of the coil assembly 102 and the second magnetic conductive plate 110 according to the embodiment in FIG. 1 of the present disclosure. As shown in FIG. 2, the coil assembly 102 is wound around a winding axis Wx to form a spiral structure (a circuit pattern). In addition, the starting end 1021 is located inside the spiral structure and the terminating end 1022 is located outside of the spiral structure.

Furthermore, as shown in FIG. 2, the second magnetic conductive plate 110 can have a rectangular structure, and the rectangular structure includes a first side 1101 and a second side 1102. The coil assembly 102 is disposed on the second magnetic conductive plate 110, and the spiral structure of the coil assembly 102 can include a curved portion 102C and a straight portion 102S. The straight portion 102S is parallel to the first side 1101 of the second magnetic conductive plate 110. Based on the design of the straight portion 102S, the length of the second side 1102 can be reduced so that the length of the wireless device 100 along the Y-axis direction can also be reduced. Additionally, the straight portion 102S can also be parallel to the second side 1102 of the second magnetic conductive plate 110 in other embodiments. It should be noted that the shape of the second magnetic conductive plate 110 is not limited to a rectangular shape. In other embodiments, the second magnetic conductive plate 110 can include a polygonal structure.

In this embodiment, the coil assembly 102 is configured to operate as a wireless charging coil. For example, the coil assembly 102 can operate as a resonant charging coil based on the standard of the Alliance for Wireless Power (A4WP), but it is not limited thereto. In some embodiments, the coil assembly 102 can operate as an inductive charging coil based on the standard of Wireless Power Consortium (WPC), such as the Qi standard.

In addition, in other embodiments, the coil assembly 102 can operate as a wireless communication coil. For example, coil assembly 102 can operate with Near-field communication (NFC) technology and its operational frequency is 13.56 MHz. In addition, the coil assembly 102 can also operate with a Radio Frequency Identification (RFID) technology and operates at frequencies below 135 KHz, at 13.56 MHz, 433.92 MHz, 860 MHz to 930 MHz, 2.45 GHz or 5.8 GHz, and so on.

Figure 3:
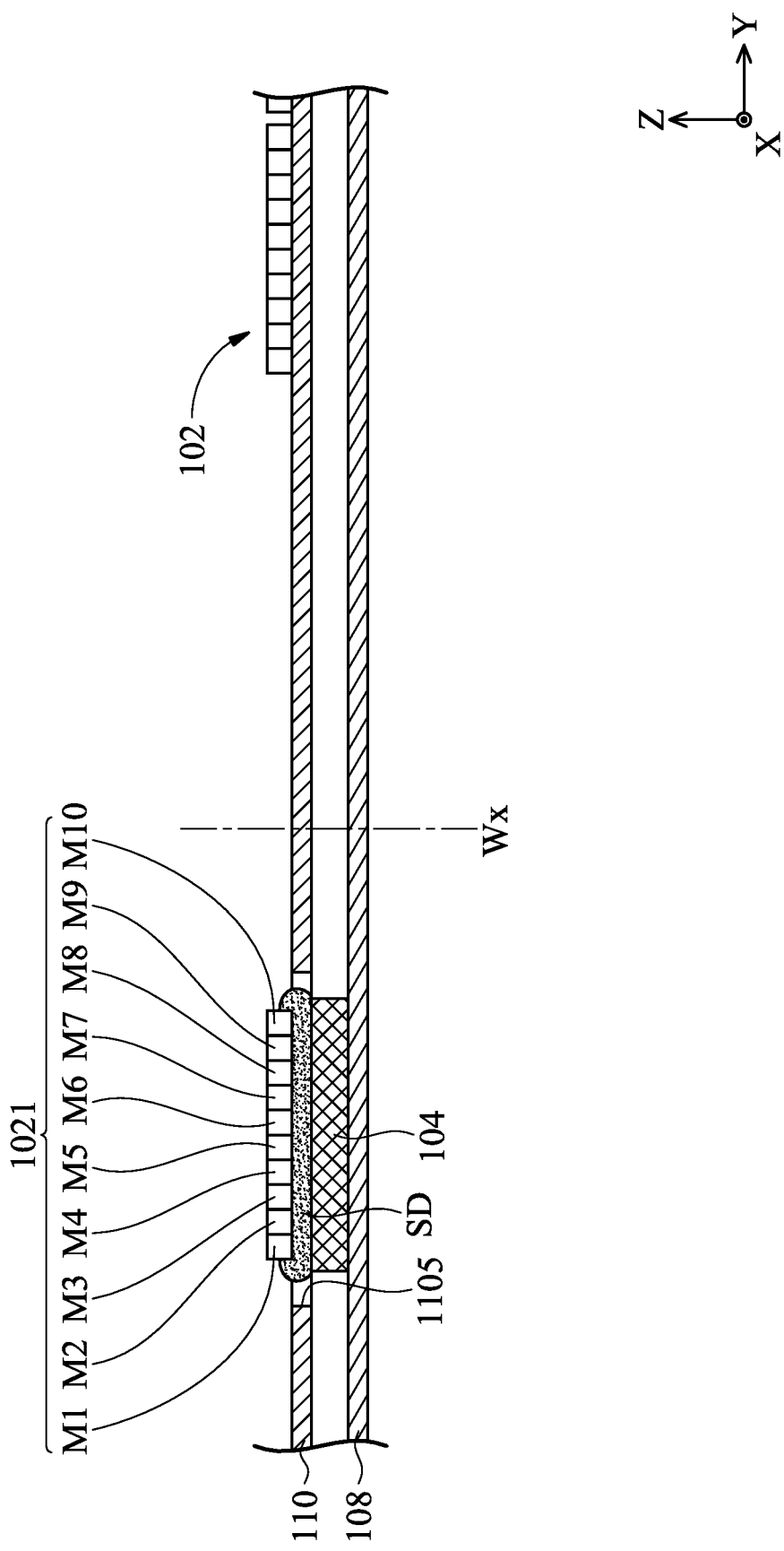
FIG. 3 shows a cross-sectional view along line A-A' in FIG. 2 according to the embodiment of the present disclosure.

Next, please refer to FIG. 2 and FIG. 3, and FIG. 3 shows a cross-sectional view along line A-A' in FIG. 2 according to the embodiment of the present disclosure. The coil assembly 102 includes at least three or more metal wires. For example, as shown in FIG. 3, the coil assembly 102 can be composed of ten metal wires M1 to M10. Specifically, the metal wires M1 to M10 are disposed along the second magnetic conductive plate 110, and the metal wires M1 to M10 are parallel to each other. Because the metal wires in the coil assembly 102 are not stacked along the Z-axis direction, the height of the wireless device 100 along the Z-axis direction can be reduced.

In this embodiment, each of the metal wires M1 to M10 has a rectangular structure, but it is not limited thereto. For example, they can have a circular structure in other embodiments. Specifically, the height of the metal wires along the Z-axis direction or the width of the metal wires along the Y-axis direction can be 0.12 mm. In addition, because the metal wires M1 to M10 are disposed along the second magnetic conductive plate 110, the area of the coil assembly 102 along the XY plane can be increased. Furthermore, because the present invention uses metal wires having a rectangular structure, the metal wires can be arranged more closely, which increases the chargeable range at the same time.

In addition, in this embodiment, the metal wires M1 to M10 in the coil assembly 102 can be connected to each other in parallel at the starting end 1021 and the terminating end 1022, so that the overall resistance value of the coil assembly 102 is decreased, thereby improving the problem of the excessive power consumption resulting from an excessive resistance value.

Furthermore, based on the structural design of the coil assembly 102 in the present embodiment, the resistance value of the coil assembly 102 can be accurately adjusted. For example, the overall resistance value of the coil assembly 102 can be adjusted by adjusting the number of metal wires in the coil assembly 102. Comparing to the conventional method of adjusting the resistance of the coil, the method of adjusting the resistance value in the present embodiment can result in a small error. For example, the error of the resistance value of the conventional coil is about 2%, and the error of the resistance value of the coil assembly 102 of the present embodiment can be 0.1%.

As shown in FIG. 2 and FIG. 3, an opening 1105 can be formed in the second magnetic conductive plate 110, the circuit board 104 is connected to the starting end 1021 through the opening 1105, and when viewed along the direction of the winding axis Wx (the Z-axis direction), as shown in FIG. 2, the opening 1105 partially overlaps the starting end 1021 of the coil assembly 102. In addition, as shown in FIG. 3, the circuit board 104 is connected to the starting end 1021 through the opening 1105. For example, the starting end 1021 can be connected to the circuit board 104 by solder SD. Because the solder SD is located in the opening 1105 and the metal wires of the starting end 1021 are not stacked along the Z-axis direction, the height of the wireless device 100 along the Z-axis direction can be reduced, so as to achieve the purpose of miniaturization.

In addition, in some embodiments, the respective portions of the first magnetic conductive plate 108 and the second magnetic conductive plate 110 that do not correspond to the circuit board 104 can be directly bonded to each other, and when viewed along a direction (the Y-axis direction) perpendicular to the direction of the winding axis Wx, the first magnetic conductive plate 108 partially overlaps the circuit board 104 or the second magnetic conductive plate 110 partially overlaps the circuit board 104, so as to further achieve the effect of miniaturization.

Figure 4:
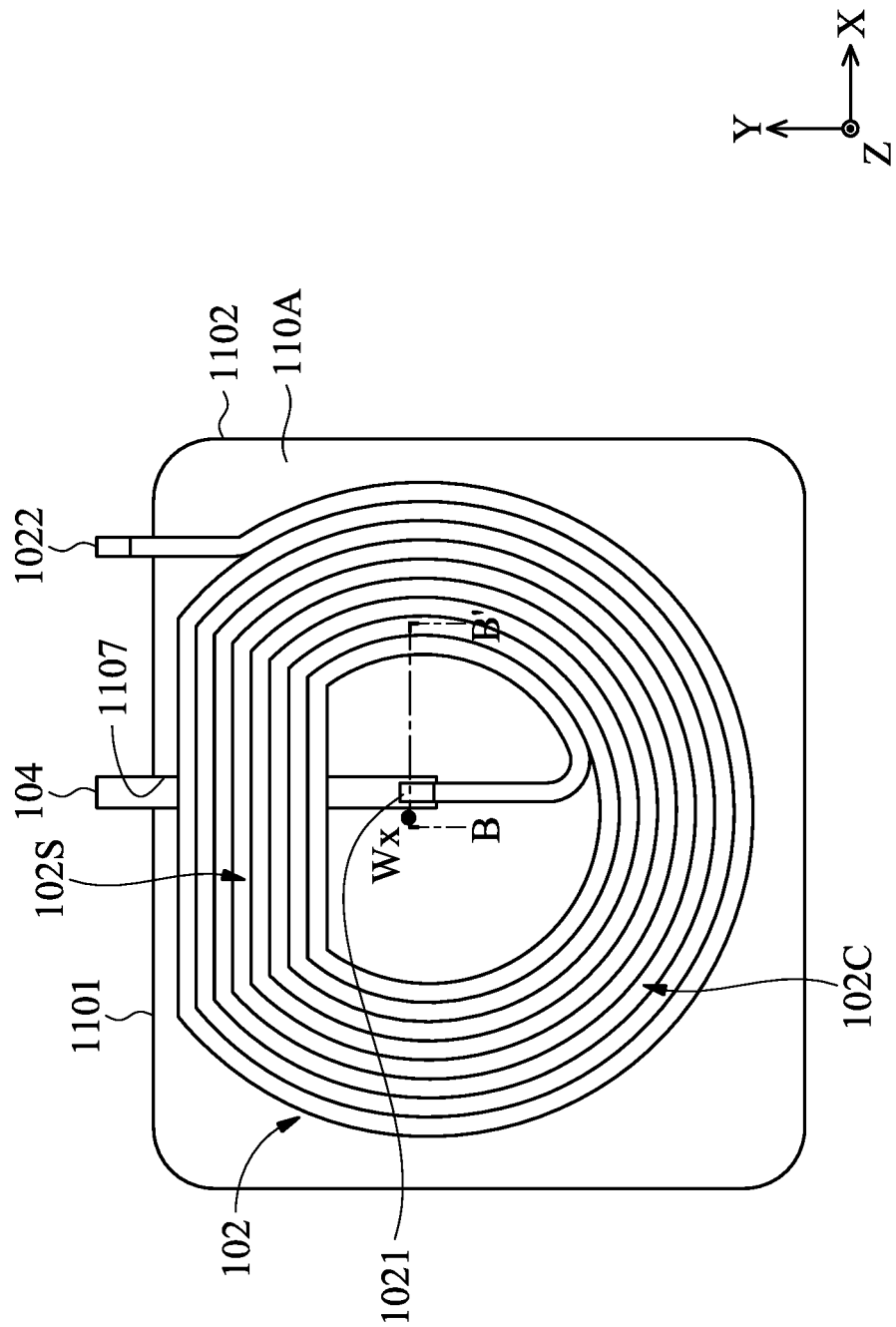
FIG. 4 shows a top view of the coil assembly, a second magnetic conductive plate, and the circuit board according to another embodiment of the present disclosure.
Figure 5:
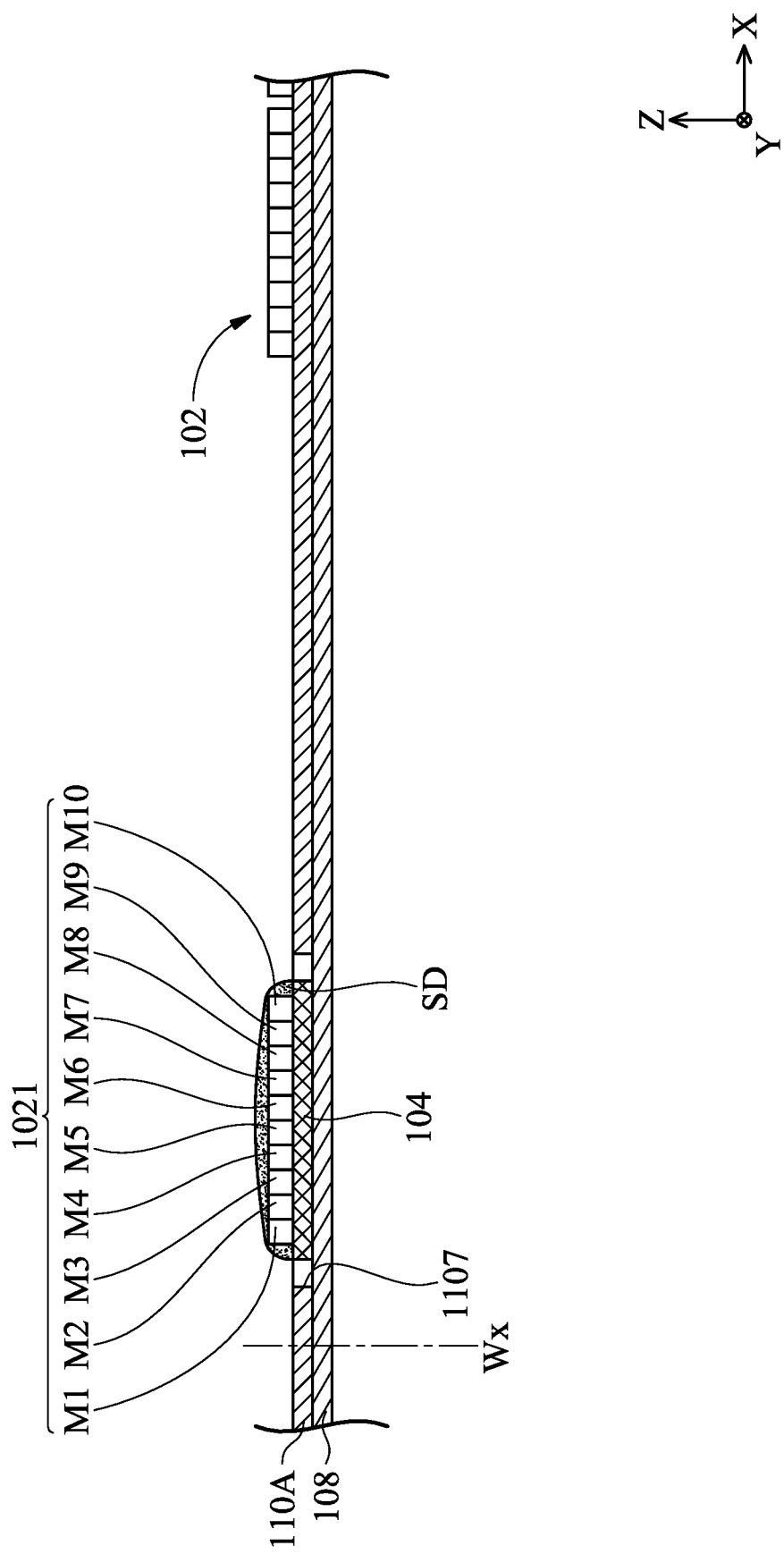
FIG. 5 shows a cross-sectional view along line B-B' in FIG. 4 according to the embodiment of the present disclosure.

Next, please refer to FIG. 4 and FIG. 5. FIG. 4 shows a top view of the coil assembly 102, a second magnetic conductive plate 110A and the circuit board 104 according to another embodiment of the present disclosure. FIG. 5 shows a cross-sectional view along line B-B' in FIG. 4 according to the embodiment of the present disclosure. This embodiment is similar to the previous embodiment. The difference between the two embodiments is that a slot 1107 is formed on the second magnetic conductive plate 110A in this embodiment. The circuit board 104 is disposed on the first magnetic conductive plate 108 and disposed in the slot 1107, and the circuit board 104 is configured to be electrically connected to the starting end 1021. For example, the circuit board 104 is connected to the starting end 1021 via the solder SD.

As shown in FIG. 4, when viewed along the direction of the winding axis Wx (the Z-axis direction), the circuit board 104 partially overlaps the starting end 1021 of the coil assembly 102. Because the circuit board 104 is disposed in the slot 1107 of the second magnetic conductive plate 110A, the height of the wireless device 100 along the Z-axis direction can be reduced further, so as to achieve the purpose of miniaturization. Moreover, because the first magnetic conductive plate 108 under the slot 1107 of the second magnetic conductive plate 110A does not have any openings, the problem of magnetic leakage can be avoided.

Figure 6:
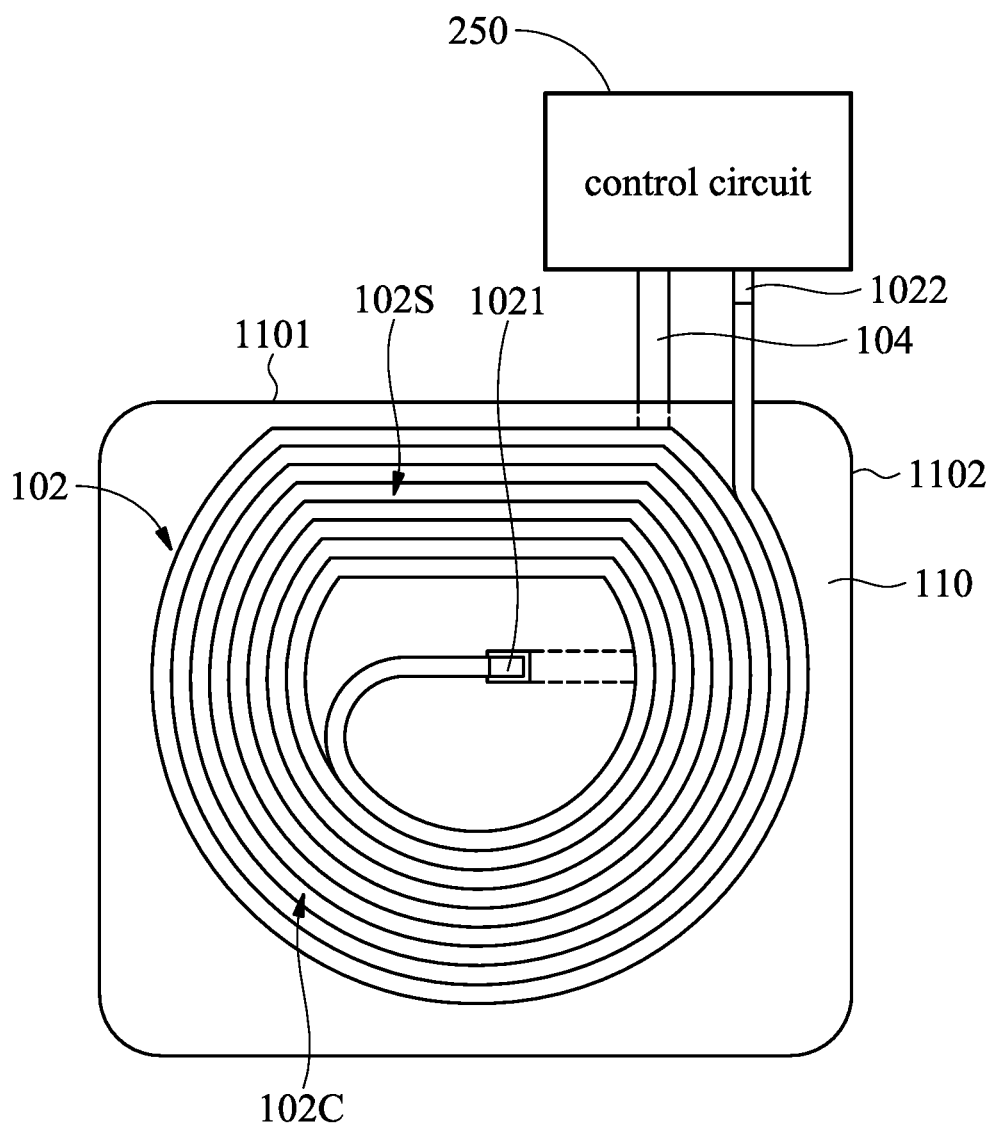
FIG. 6 shows a diagram of a wireless device according to another embodiment of the present disclosure.

Please refer to FIG. 6, which shows a diagram of a wireless device 200 according to another embodiment of the present disclosure. The structure of the wireless device 200 is similar to the structure of the wireless device 100 in FIG. 1. The difference between the two embodiments is that the wireless device 200 in this embodiment further includes a control circuit 250 which is electrically connected to the starting end 1021 and the terminating end 1022.

In this embodiment, the coil assembly 102 includes at least three metal wires, such as the metal wires M1 to M10, and the metal wires are separately connected to the control circuit 250. The control circuit 250 can have different circuits or switches (such as MOS switches) to control the electrical connections of the metal wires. For example, the control circuit 250 can control the metal wires M1 to M10 to be electrically connected to each other in parallel or in series.

When the control circuit 250 controls the metal wires M1 to M10 to be electrically connected to each other in parallel, that is, the metal wires M1 to M10 can form ten coils in parallel, and the coil assembly 102 can operate in a wireless charging mode at this time. Because the ten metal wires M1 to M10 are connected to each other in parallel, the overall resistance value of the coil assembly 102 can be reduced, and the overall charging performance can also be improved.

In some embodiments, the control circuit 250 can control the metal wires M1 to M10 to be electrically connected to each other in series. For example, the metal wire M1 is connected to the metal wire M2 in parallel, the metal wire M3 is connected to the metal wire M4 in parallel, and then the metal wires M3 and M4 are connected to the metal wires M1 and M2 in series, and the like. Thus, the metal wires M1 to M10 can form five coils in series so as to adjust the overall inductance of the coil assembly 102, so that the coil assembly 102 can operate in a wireless communication mode. The connection manner of the metal wires M1 to M10 is not limited to the above embodiments, and the metal wires can be adjusted to be connected in parallel or in series depending on practical requirements, so that the coil assembly 102 can operate in the desired frequency band.

Figure 7:
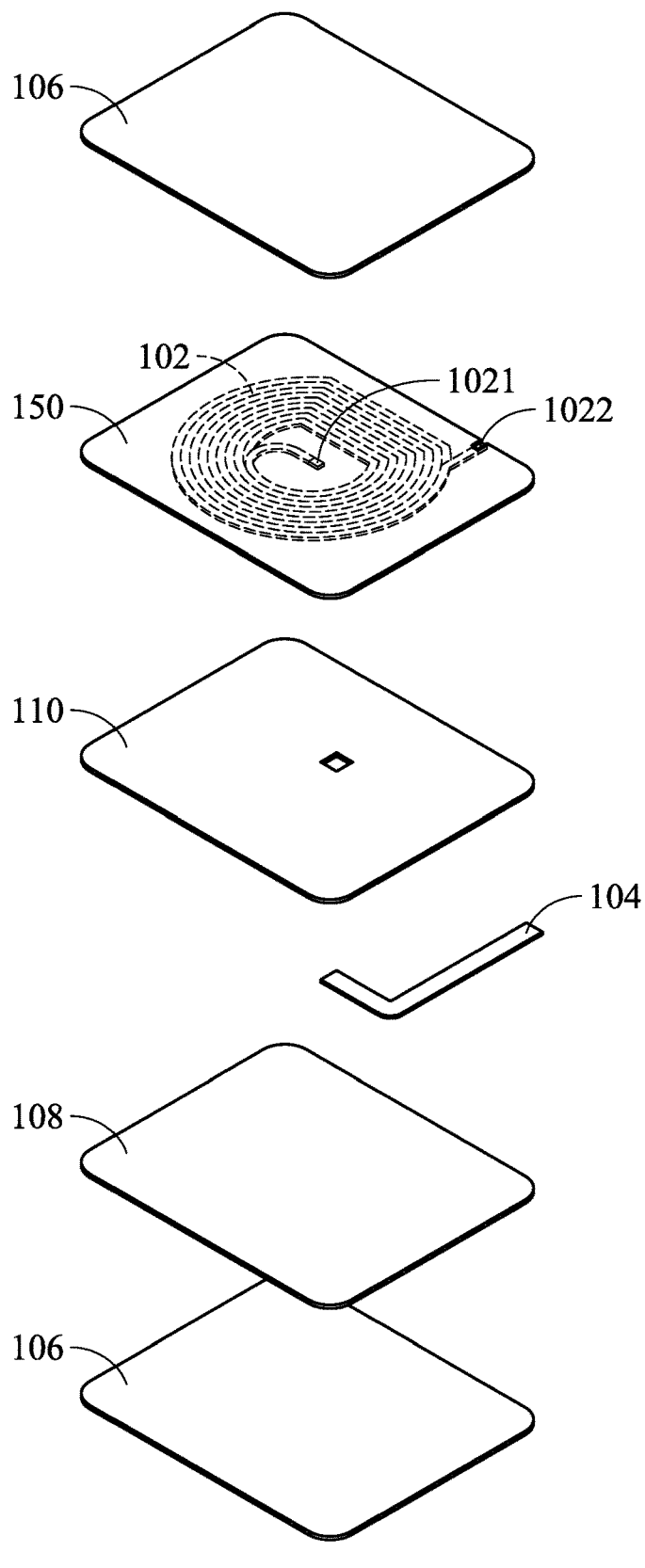
FIG. 7 is an exploded diagram of a wireless device according to another embodiment of the present disclosure.

Please refer to FIG. 7, which is an exploded diagram of a wireless device 300 according to another embodiment of the present disclosure. The wireless device 300 is similar to the wireless device 100 in FIG. 1. The difference between these two embodiments is that the wireless device 300 in this embodiment further includes a flexible circuit board 150, and the coil assembly 102 is integrally formed in the circuit board 150. In this embodiment, the thickness of the circuit board 150 along the Z-axis direction can be 0.05 mm, which is smaller than the height of the metal wires along the Z-axis direction (for example, 0.12 mm) in the foregoing embodiment (FIG. 3).

Therefore, in this embodiment, based on the design of the coil assembly 102 integrally formed in the circuit board 150, the height of the wireless device 300 along the Z-direction can be reduced further, so as to achieve the purpose of miniaturization.

In conclusion, the present disclosure provides a wireless device that can be disposed on a main circuit board of an electronic device, and the wireless device can include two magnetic conductive plates. The thickness of the first magnetic conductive plate 108 is greater than the thickness of the second magnetic conductive plate 110, and the first magnetic conductive plate 108 is closer to the aforementioned main circuit board. Based on this structural design, the two magnetic conductive plates can effectively reduce the risk of affecting various electronic components on the main circuit board by the electromagnetic waves generated by the coil assembly 102 according to the surface effect, and can also improve the operational efficiency of the wireless device.

Furthermore, the coil assembly 102 can include at least three metal wires that can be separately connected to the control circuit 250, and the control circuit 250 can control the metal wires to be electrically connected in parallel or in series. When the control circuit 250 controls the metal wires to be electrically connected in parallel, the overall resistance value of the coil assembly 102 can be reduced so as to operate in a wireless charging mode. When the control circuit 250 controls the metal wires to be electrically connected in series, the overall inductance of the coil assembly 102 can be adjusted so that the coil assembly 102 can operate in a wireless communication mode. Therefore, the control circuit 250 can switch the wireless device between different modes (for example, different types of charging modes such as inductive wireless charging, resonant wireless charging, and other wireless communication modes such as near field communication).

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wireless device, comprising:
 a first magnetic conductive plate;
 a second magnetic conductive plate, disposed on the first magnetic conductive plate; and
 a coil assembly, disposed on the second magnetic conductive plate, the coil assembly comprising a starting end and a terminating end, and the coil assembly being wound around a winding axis to form a spiral structure, wherein the terminating end is located outside of the spiral structure;

a circuit board disposed between the first magnetic conductive plate and the second magnetic conductive plate, and the circuit board is configured to be electrically connected to the starting end;

wherein the coil assembly comprises at least three metal wires, and the metal wires are arranged parallel to each other along the second magnetic conductive plate and are connected to each other in parallel at the starting end and the terminating end.

2. The wireless device as claimed in claim 1, wherein an opening is formed on the second magnetic conductive plate, the circuit board is connected to the starting end through the opening, and the opening partially overlaps the starting end of the coil assembly when viewed along the winding axis.

3. The wireless device as claimed in claim 2, wherein a portion of the first magnetic conductive plate and a portion of the second magnetic conductive plate that do not correspond to the circuit board are directly bonded to each other.

4. The wireless device as claimed in claim 3, wherein when viewed along a direction perpendicular to the winding axis, the first magnetic conductive plate partially overlaps the circuit board or the second magnetic conductive plate partially overlaps the circuit board.

5. The wireless device as claimed in claim 1, wherein the circuit board partially overlaps the coil assembly when viewed along the winding axis.

6. The wireless device as claimed in claim 1, wherein the second magnetic conductive plate has a polygonal structure, the coil assembly includes a straight portion, and the straight portion is parallel to one side of the polygonal structure of the second magnetic conductive plate.

7. The wireless device as claimed in claim 1, wherein a thickness of the first magnetic conductive plate is greater than a thickness of the second magnetic conductive plate.

8. The wireless device as claimed in claim 1, further comprising a flexible circuit board, and the coil assembly and the flexible circuit board are integrally formed in one piece.

9. A wireless device, comprising:
a first magnetic conductive plate;
a second magnetic conductive plate, disposed on the first magnetic conductive plate; and
a coil assembly, disposed on the second magnetic conductive plate, the coil assembly comprising a starting end and a terminating end, and the coil assembly being wound around a winding axis to form a spiral structure, wherein the terminating end is located outside of the spiral structure;

a circuit board disposed on the first magnetic conductive plate and configured to be electrically connected to the starting end;

wherein the coil assembly comprises at least three metal wires, and the metal wires are arranged parallel to each other along the second magnetic conductive plate and are connected to each other in parallel at the starting end and the terminating end;

wherein a slot is formed on the second magnetic conductive plate, and the circuit board is disposed in the slot.

10. The wireless device as claimed in claim 9, wherein a portion of the first magnetic conductive plate and a portion of the second magnetic conductive plate that do not correspond to the circuit board are directly bonded to each other.

11. The wireless device as claimed in claim 10, when viewed along a direction perpendicular to the winding axis, the first magnetic conductive plate partially overlaps the circuit board or the second magnetic conductive plate partially overlaps the circuit board.

12. The wireless device as claimed in claim 9, wherein the circuit board partially overlaps the coil assembly when viewed along the winding axis.

13. The wireless device as claimed in claim 9, wherein the first magnetic conductive plate under the slot of the second magnetic conductive plate does not have any openings for avoiding magnetic leakage.

14. The wireless device as claimed in claim 9, wherein the second magnetic conductive plate has a polygonal structure, the coil assembly includes a straight portion, and the straight portion is parallel to one side of the polygonal structure of the second magnetic conductive plate.

15. The wireless device as claimed in claim 9, wherein a thickness of the first magnetic conductive plate is greater than a thickness of the second magnetic conductive plate.

16. The wireless device as claimed in claim 9, further comprising a flexible circuit board, and the coil assembly and the flexible circuit board are integrally formed in one piece.

* * * * *